(12) United States Patent
McGough et al.

(10) Patent No.: US 6,690,190 B2
(45) Date of Patent: Feb. 10, 2004

(54) MOTOR COMPONENT TEST ARRANGEMENT INCLUDING MULTIPLE TEST STATIONS

(75) Inventors: Taggert McGough, Dayton, OH (US); David E. Clark, Troy, OH (US)

(73) Assignee: Odawara Automation, Inc., Tipp City, OH (US)

( * ) Notice: Subject to any disclaimer, the term of this patent is extended or adjusted under 35 U.S.C. 154(b) by 0 days.

(21) Appl. No.: 09/935,210

(22) Filed: Aug. 22, 2001

(65) Prior Publication Data

US 2003/0038652 A1 Feb. 27, 2003

(51) Int. Cl.7 .......................... G01R 31/06; G01R 31/02
(52) U.S. Cl. .................... 324/772; 324/158; 324/545
(58) Field of Search ................... 324/772, 545, 324/546, 547, 158.1; 322/99; 340/648; 702/108; 198/339.1

(56) References Cited

U.S. PATENT DOCUMENTS

| | | | |
|---|---|---|---|
| 3,797,632 A | 3/1974 | Riggs | 198/339.1 |
| 3,845,286 A | 10/1974 | Aronstein et al. | 700/102 |
| 3,952,388 A | 4/1976 | Hasegawa et al. | 29/33 P |
| 4,027,246 A | 5/1977 | Caccoma et al. | 700/121 |
| 4,069,764 A | 1/1978 | Teyssedre | 198/339.1 |
| 4,475,642 A | 10/1984 | Fritz | 198/345.3 |
| 4,719,694 A | 1/1988 | Herberich et al. | 198/341.03 |
| 4,815,673 A | 3/1989 | Wheeler | 198/346.1 |
| 5,084,829 A | 1/1992 | Kato | 700/245 |
| 5,675,247 A * | 10/1997 | Miller et al. | 324/158.1 |
| 5,680,936 A * | 10/1997 | Beers | 209/564 |
| 6,253,904 B1 | 7/2001 | Soldavini | 198/431 |

* cited by examiner

Primary Examiner—Ernest Karlsen
(74) Attorney, Agent, or Firm—Thompson Hine LLP

(57) ABSTRACT

An electric motor component testing system includes test stations located along different conveyor lanes.

17 Claims, 4 Drawing Sheets

MOTOR COMPONENT TEST ARRANGEMENT INCLUDING MULTIPLE TEST STATIONS

TECHNICAL FIELD

The present invention relates generally to manufacturing and, more particularly, to a system and method for testing electric motor components such as armatures or stators moving along a manufacturing line.

BACKGROUND OF THE INVENTION

Armature and stator manufacturing lines have in the past included a conveyor extending from station to station of the manufacturing process. In many cases winding operations have taken place using machines which remove the armature or stator from the conveyor and subsequently replace the part on the conveyor. After the components have been wound and lead wires fused, testing of the armatures is conducted. The types of tests conducted may include a hi-pot test, a surge test and a resistance test.

While the primary focus of the discussion contained herein focuses on armatures, it is recognized that other electric motor components, such as stators for example, could also be tested.

As used herein the term "hi-pot" is short for high potential, with the hi-pot test involving the application of a relatively high potential voltage across test contacts where one test contact is associated with one lead of the component winding and the other test contact is associated with the metal of the component. The hi-pot test is used to determined the integrity of the insulation between the armature coil and the armature metal. As used herein the term "hi-pot test head" is used to refer to a test head configured for conducting a hi-pot test. As used herein the term "hi-pot test station" is used to refer to a location at which the necessary contacts used to perform a hi-pot test are located during a test and may encompass a hi-pot test head if used, but does not necessarily require the use of a test head. As used herein the term "surge test" refers to a commonly practiced test which looks for breakdown between adjacent wires of the component coil(s). As used herein the term "resistance test" refers to a commonly known test for checking or measuring the contact resistance between each of the bonding points between the component and its associated coil wires. The term "surge/resistance test head" is used to refer to a test head configured for conducting one or both of a surge test and a resistance test. The term "surge/resistance test station" is used to refer to a location at which the necessary contacts used to perform a surge and/or resistance test are located during a test and may encompass a surge/resistance test head if used, but does not necessarily require the use of a test head. The term "surge/resistance test console" is used to refer to a test console capable of conducting one or both of a surge test and a resistance test. As used herein the term "component type" is defined by the overall configuration of the component and it is contemplated, for example, that different armature configurations define respectively different component types.

In implementing testing systems two primary factors of concern are cost and speed. It is known in the past to utilize first and second surge/resistance test heads located along a single conveyor lane, with both surge/resistance test heads connected to a single surge/resistance test console to be controlled thereby. The surge/resistance test console alternatingly conducts tests between the two surge/resistance test heads. Unfortunately such systems are still speed limited in that the conveyor lane cannot be moved while either test is going on, and therefore components must be moved in and out of testing positions at the same time.

Accordingly, it would be advantageous to provide a testing system providing increased speed.

SUMMARY OF THE INVENTION

In one aspect, an electric motor component testing system includes a first conveyor lane and a second conveyor lane. A first hi-pot test station is positioned along the first conveyor lane for testing components moved along the first conveyor lane and a second hi-pot test station is positioned along the second conveyor lane for testing components moved along the second conveyor lane. A first hi-pot controller is connected for controlling tests by the first hi-pot test station. A second hi-pot controller is connected for controlling tests by the second hi-pot test station. A first surge/resistance test station is positioned along the first conveyor lane downstream of the first hi-pot test station for testing components moved along the first conveyor lane. A second surge/resistance test station is positioned along the second conveyor lane downstream of the second hi-pot test station for testing components moved along the second conveyor lane. A single test console is connected for receiving test data from each of the first and second hi-pot controllers, the single test console connected for controlling each of the first and second surge/resistance test stations for conducting non-simultaneous tests by the first and second surge/resistance test stations.

In another aspect, an electric motor component testing system includes a first conveyor lane and a second conveyor lane. A first surge/resistance test station is positioned along the first conveyor lane for testing components moved along the first conveyor lane and a second surge/resistance test station positioned along the second conveyor lane for testing components moved along the second conveyor lane. A single test console is connected for controlling each of the first and second surge/resistance test stations for conducting non-simultaneous tests by the first and second surge/resistance test stations.

In a further aspect, a part testing system is provided for a manufacturing line including first and second work flow conveyor lanes. The system includes a first test station positioned along the first work flow conveyor lane for testing parts moved along the first work flow conveyor lane and a second test station positioned along the second work flow conveyor lane for testing parts moved along the second work flow conveyor lane. A single test console is connected for controlling each of the first and second test stations for conducting non-simultaneous tests by the first and second test stations.

DETAILED DESCRIPTION

Figure 1:
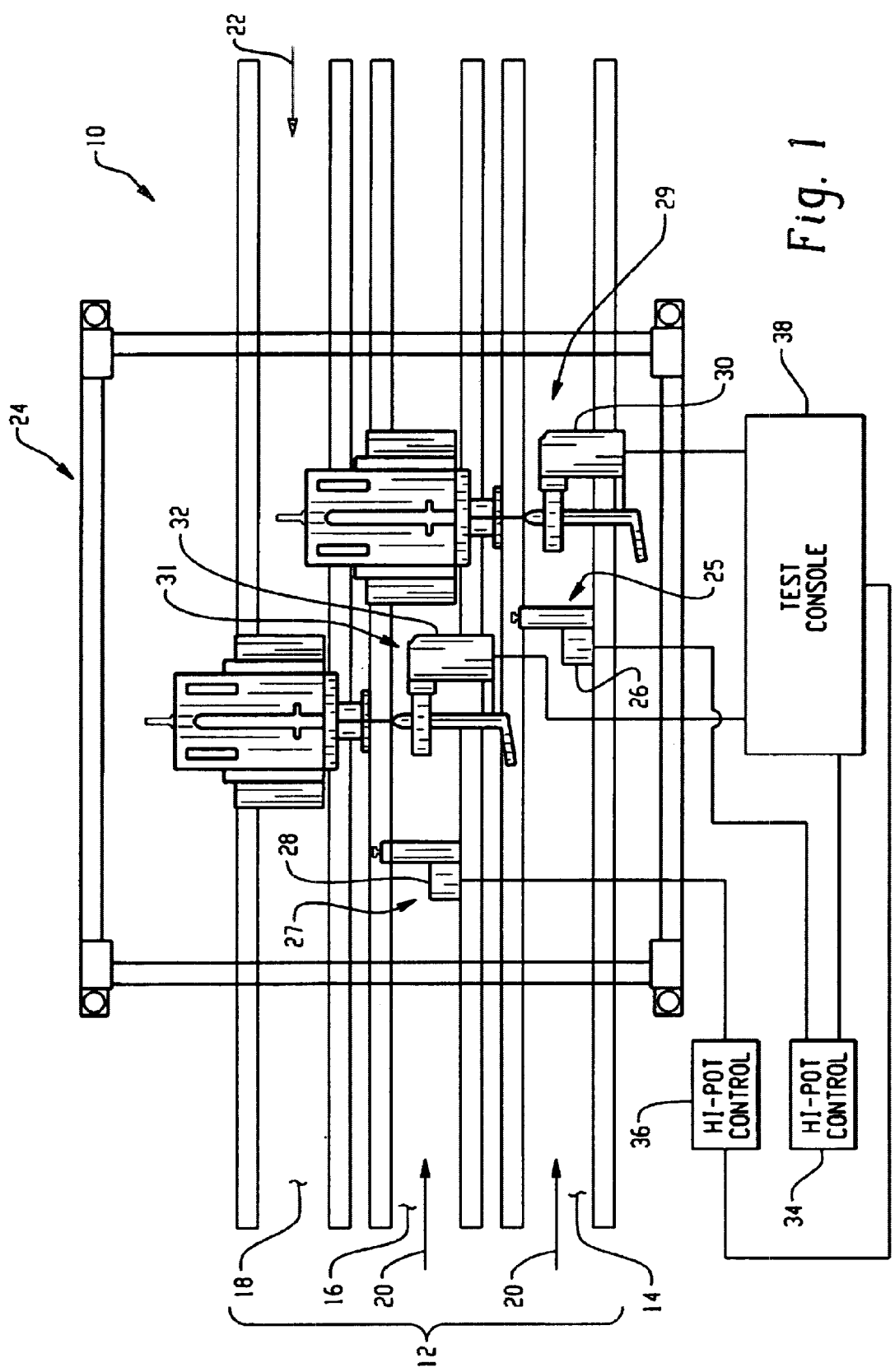
FIG. 1 is a schematic top view of one embodiment of a testing system.

Referring to FIG. 1, a testing system 10 is shown and includes a manufacturing line 12 formed by three conveyor lanes 14, 16 and 18. Conveyor lanes 14 and 16 are work flow conveyor lanes for carrying parts, such as armatures, along the manufacturing line from station to station in direction 20. The parts may, for example, be carried on part pallets. Conveyor lane 18 is a return conveyor lane which may be used for returning empty pallets back in the opposite direction 22 to the start of the manufacturing line for reuse.

A testing station of the line 12 is defined at 24 and, in the illustrated embodiment, includes two test stations positioned along each conveyor lane 14 and 16. In particular, a hi-pot test station 25 and 27 is positioned along each conveyor lane followed by a surge/resistance test station 29 and 31 positioned along each conveyor lane. The stations may include respective test heads 26, 28, 30 and 32 thereat. The construction of such test heads is known in the art of armature testing, with each head typically configured for testing a armature of a given size/type. Generally, the hi-pot test heads 26 and 28 include a at least one contact for contacting a armature winding and at least one contact for contacting the metal core of the armature. Additional contacts may be provided according to the number of armature windings. The surge/resistance test heads 30 and 32 may include a number of contacts corresponding to the number of commutator bars on the armature for checking or measuring the resistance resistance of the bonding point between each commutator bar and its associated coil lead and/or for sending a surge waveform through the coils to look for breakdown between adjacent wires.

Each hi-pot test head 26 and 28 is connected to a respective hi-pot controller 34 and 36 for controlling the testing operation of the hi-pot test stations 25 and 27. By way of example, and not by way of limitation, each hi-pot controller may be a HypoUltra II Dielectric Analyzer, Model No. 7530DT produced by Associated Research, Inc. Each of the surge/resistance test stations 29 and 31 is connected to the same test console 38 which includes a controller for conducting surge/resistance tests and also includes processing circuitry for collecting data from tests. By way of example, and not by way of limitation, the test console may be an Armature Test System Model 1730 produced by The Slaughter Company. The test console 38 is also connected for receiving test data from each of the hi-pot controllers 34 and 36 so that all test data for each armature can be recorded together and made available if needed.

Figure 2:
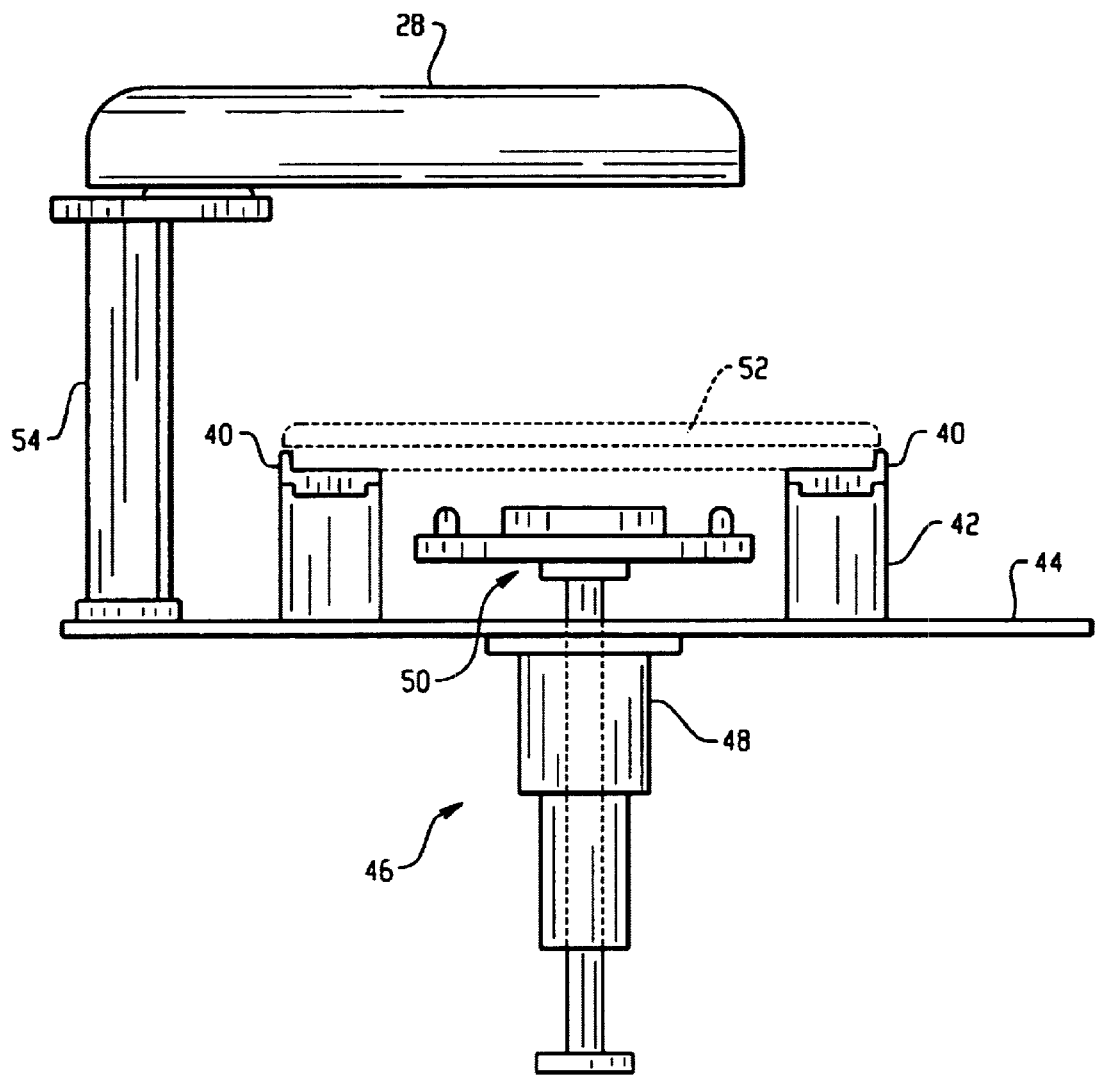
FIG. 2 is a side elevation view of one testing position of the system of FIG. 1.

Referring now to FIG. 2, an exemplary elevation view of conveyor lane 16 below test head 28 is shown. The conveyor lane 16 may be formed by spaced apart conveyor rails 40 mounted via suitable structure 42 to a frame 44. Also mounted to frame 44 is an elevator of lift mechanism 46 which may be formed by a pneumatic cylinder assembly 48. A lift head 50 of the assembly is positioned for upward movement between the conveyor rails 40 for moving a part (such as a pallet 52 holding an armature) up into test position beneath the test head 28. The test head 28 may be mounted to a support bracket 54 also attached to frame 44. It is recognized that a similar lift arrangement may be provided beneath the other test heads 36, 30 and 32 for moving parts up into testing position with respect to each of such heads. Alternatively the test heads at each of the stations may be vertically moveable for coming down into contact with the armature. Further, in some cases the test station may be formed by a stationary set of contact members and no head. For example, in the case of the hi-pot test stations static brush probes could be positioned to make suitable contact with the armature as it moves thereby.

Figure 3:
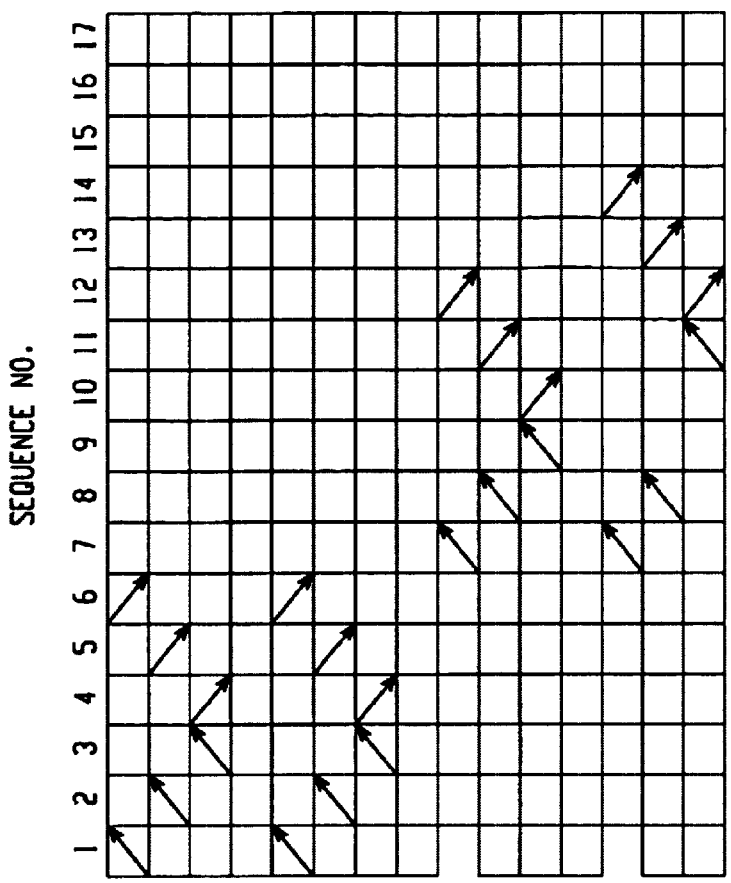
FIG. 3 is an exemplary tester sequence for the system of FIGS. 1 and 2.

In operation, the hi-pot controllers 34 and 36 may operate simultaneously to conduct hi-pot tests on distinct armatures on each conveyor lane 14 and 16. In contrast, the test console 38 is configured such that simultaneous tests by the surge/resistance test heads 30 and 32 do not take place. In particular, referring to the tester sequence depicted in the table of FIG. 3, it is seen that the hi-pot test operations can take place simultaneously for heads 26 (lane 1) and 28 (lane 2). In contrast, surge/resistance tests by test head 30 and 32 cannot take place simultaneously. Instead, for example, where a test is first conducted by head 30 (lane 1) as shown in sequence columns 9 and 10, the test by head 32 (lane 2) cannot begin until after completion of the test by head 30 as indicated in sequence column 11. Importantly, however, during the test by head 32, the armature last tested by head 30 can be conveyed away from test head 30 in preparation for a next test of a next armature moving along conveyor lane 14. It is recognized that the tester sequence shown in FIG. 3 is representative only and that in real world application numerous different sequences will take place depending upon a variety of factors taking place for each conveyor lane 14 and 16. However, FIG. 3 does fairly depict the fact that test operations do not take place simultaneously between heads 30 and 32, but that armatures being tested can be moved relative to one of the test heads 30 and 32 while the other of the test heads is conducting a test. It is contemplated that normally a given surge/resistance test station will conduct both a surge test and a resistance test on a given component back to back before the other surge/resistance test station begins testing.

Figure 4:
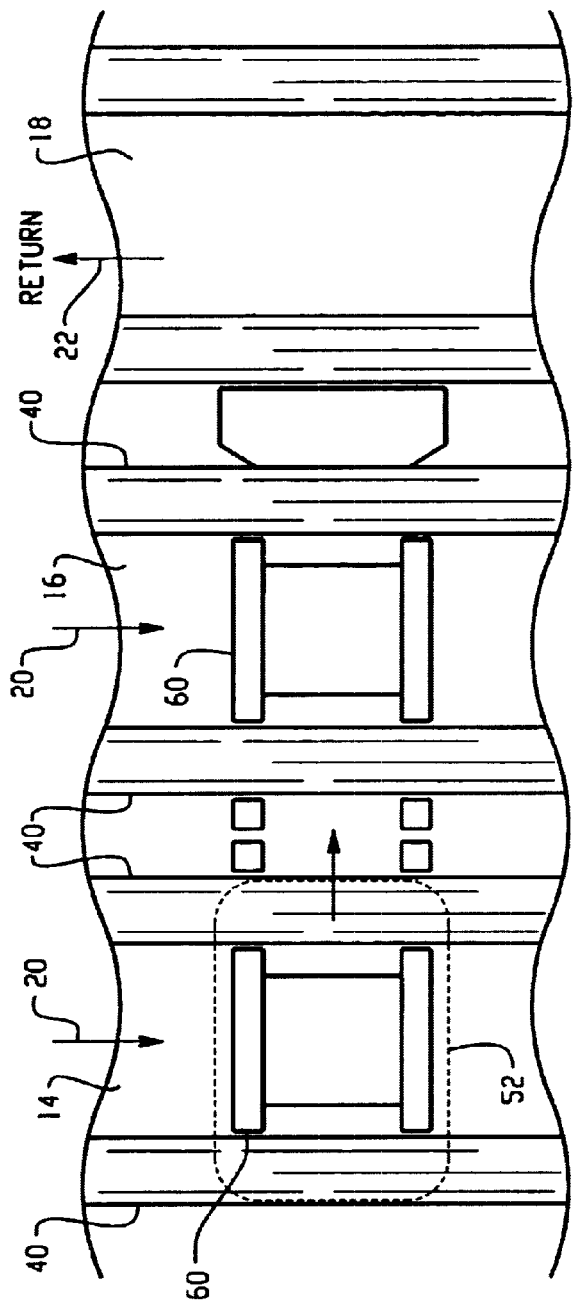
FIG. 4 depicts one arrangement for transferring components from one conveyor lane to another.
Figure 5:
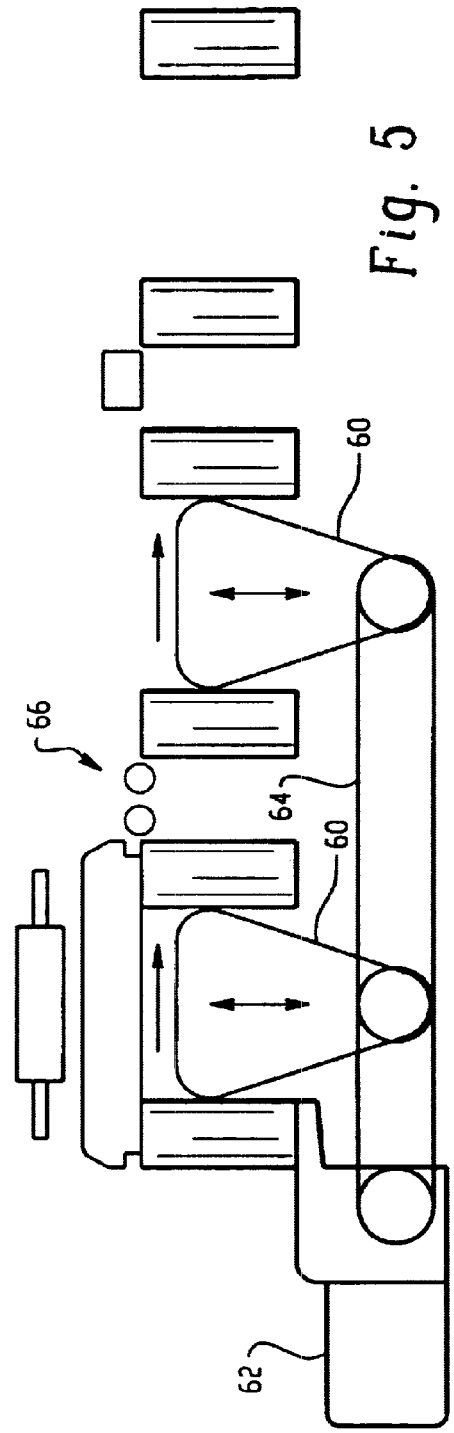
FIG. 5 is an elevation view of the arrangement of FIG. 4.

In one embodiment, the hi-pot test heads 26 and 28 may be configured the same and the surge/resistance test heads 30 and 32 may be configured the same such that the same armature type is tested on each conveyor lane 14 and 16. In such cases, suitable structure such as that shown in FIGS. 4 and 5 can be used for shifting armatures between the two lane 14 and 16. In particular, such structure may be formed by lateral conveyors 60 each of which is positioned along a respective conveyor lane 14 and 16 between the lanes conveyor rails 40. The lateral conveyors may be driven by a gear motor 62 and belt arrangement 64. The two conveyors 60 are laterally aligned along the length of line 12 and are each movable vertically upward. When so moved vertically upward one of the conveyors 60 lifts a pallet 52 on which the armature may be positioned. The gear motor is then driven to transfer the pallet 52 from one conveyor 60 to another so that the pallet is switched between conveyor lanes. Suitable roller bearings 66 may be mounted along the gap between the raised conveyors 60 for supporting the pallet 52 as it spans the gap. This type of transfer arrangement is commonly called a Tandem Lift-Transfer Unit and is available from Bosch as Model No. EQ2/TR. Of course, other transfer arrangements could be used as well. For example, a movable transfer arm could simply guide a transport pallet on one conveyor lane to another conveyor lane or an overhead pick and place arrangement could be provided. In all such embodiments the system facilitates continued testing of all armatures even if one of the test heads along a given conveyor lane fails.

In another embodiment hi-pot test head 26 and surge/resistance test head 30 may be configured for testing armatures of a first type and hi-pot test head 28 and surge/resistance test head 32 may be configured for testing armatures of a second type. Such an embodiment facilitates a more flexible manufacturing operation.

Although the invention has been described above in detail referencing the preferred embodiments thereof, it is recognized that various changes and modifications could be made without departing from the spirit and scope of the invention.

For example, and as previously noted, while the embodiment of the testing system is described in detail above with reference to testing of armatures, it is recognized that similar testing systems could be used in conjunction with other electric motor components such as stators, as well as other parts.

What is claimed is:

1. A part testing system for a manufacturing line, the system comprising:

first and second work flow conveyor lanes for carrying parts through multiple stations of the manufacturing line, the conveyor lanes positioned alongside wach other;

a first test station positioned along the first work flow conveyor lane for testing parts moved along the first work flow conveyor lane, prior to test the parts move toward the first test station along the first work flow conveyor lane and after test the parts move away from the first test station along the first work flow conveyor lane;

a second test station positioned along the second work flow conveyor lane for testing parts moved along the second work flow conveyor lane, prior to the test parts move toward the second test station along the second work flow conveyor lane and after test the parts move away from the second test station along the second work flow conveyor lane; and a single test console connected for controlling each of the first and second test stations for conducting non-simultaneous tests by the first and second test stations.

2. The part testing system of claim 1 wherein during a test by the first test station a just tested part of the second test station is conveyed away from the second test station.

3. The component testing system of claim 1 wherein the first test station is positioned above the first work flow conveyor lane and the second test station is position above the second work flow conveyor lane, the system further comprising:

a first elevator positioned below the first test station for lifting a part off the first work flow conveyor lane up to the first test station; and a second elevator positioned below the second test station for lifting a part off the second work flow conveyor lane up to the second test station.

4. The part testing system of claim 1, further comprising means for shifting parts of the first work flow conveyor lane to the second work flow conveyor lane for testing in the event of failure of the first test station.

5. The part testing system of claim 1 wherein the first test station is configured for testing a first part-type and the second test-station is configured for testing a second part-type.

6. A part testing system, comprising:

a first conveyor lane;

a second conveyor lane alongside the first conveyor lane;

a first hi-pot test station positioned along the first conveyor lane testing parts along the first conveyor lane;

a second hi-pot test station positioned along the second conveyor lane testing parts moved along the second conveyor lane;

a first hi-pot controller connected for controlling tests by the first hi-pot test station;

a second hi-pot controller connected for controlling tests by the second hi-pot test station;

a third test station positioned along the first conveyor lane downstream of the first hi-pot test station for testing parts moved along the first conveyor lane;

a fourth test station positioned along the second conveyor lane downstream of the second hi-pot test station for testing parts moved along the second conveyor lane; and a single test console connected for controlling each of the third and fourth test stations for conducting non-simultaneous tests by the third and fourth test stations.

7. The part testing system of claim 6 wherein during a test by the third test station a just tested part of the fourth test station is conveyed away from the fourth test station.

8. The part testing system of claim 6 wherein each of the first and second hi-pot test stations and the third and fourth test stations is positioned above its respective conveyor lane, the system further comprising:

a first elevator positioned below the first hi-pot test station for lifting parts off the first conveyor lane and up to the first hi-pot test station;

a second elevator positioned below the second hi-pot test station for lifting parts off the second conveyor lane and up to the second hi-pot test station;

a third elevator positioned below the third test station for lifting parts off the first conveyor lane up to the third test station; and a fourth elevator positioned below the fourth test station for lifting parts off the second conveyor lane up to the third test station.

9. The part testing system of claim 6 wherein each test station is defined at least in part by a respective test head.

10. The part testing system of claim 6 wherein the part is a motor-type part.

11. A part testing system, comprising:

a first conveyor lane;

a second conveyor lane alongside the first conveyor lane;

a first test station positioned above the first conveyor lane for testing parts moved along the first conveyor lane, after testing the parts move away from the first test station along the first conveyor lane to another manufacturing station along the first conveyor lane;

a second test station positioned above the second conveyor lane for testing parts moved along the second conveyor lane, after testing the parts move away from the second test station along the second conveyor lane to another manufacturing station along the second conveyor lane;

a single test console connected for controlling each of the first and second test stations for conducting non-simultaneous tests by the first and second test stations.

12. The part testing system of claim 11 wherein during a test by the first test station a just tested part of the second test station is conveyed away from the second test station.

13. The part testing system of claim 11 further comprising:

a first elevator positioned below the first test station for lifting parts off the first conveyor lane up to the first test station; and a second elevator positioned below the second test station for lifting parts off the second conveyor lane up to the second test station.

14. The part testing system of claim 11, further comprising means for shifting parts from the first conveyor lane to the second conveyor lane for testing in the event of failure of the first test station.

15. The part testing system of claim 11 wherein the first test station is configured for testing a first part-type and the second station is configured for testing a second part-type.

16. The part testing system of claim 11 wherein each test station is defined at least in part by a respective test head.

17. The part testing system of claim 11 wherein the part is a motor-type part.

* * * * *

UNITED STATES PATENT AND TRADEMARK OFFICE
CERTIFICATE OF CORRECTION

PATENT NO. : 6,690,190 B2
DATED : February 10, 2004
INVENTOR(S) : Taggert McGough It is certified that error appears in the above-identified patent and that said Letters Patent is hereby corrected as shown below:

Column 5,
Line 12, change "wach" to -- each --;
Line 22, change "to the test" to -- to test the --.
Line 31, change "component" to -- part --;
Line 33, change "position" to -- positioned --.
Line 53, after the word "lane" (first occurrence) insert -- for --.
Line 53, after the word "parts" insert -- moved --;
Line 55, after the word "lane" insert -- for --.

Column 6,
Line 15, delete the word "and" at the end of the line.

Signed and Sealed this

Twentieth Day of April, 2004

JON W. DUDAS
*Acting Director of the United States Patent and Trademark Office*